(12) United States Patent
Kiple et al.

(10) Patent No.: US 8,933,347 B2
(45) Date of Patent: Jan. 13, 2015

(54) COMPONENTS OF AN ELECTRONIC DEVICE

(76) Inventors: Bryan P. Kiple, Los Gatos, CA (US); Charles B. Woodhull, San Francisco, CA (US); David A. Pakula, San Francisco, CA (US); Tang Y. Tan, San Francisco, CA (US)

( * ) Notice: Subject to any disclaimer, the term of this patent is extended or adjusted under 35 U.S.C. 154(b) by 9 days.

(21) Appl. No.: 13/610,779

(22) Filed: Sep. 11, 2012

(65) Prior Publication Data

US 2013/0319755 A1 Dec. 5, 2013

Related U.S. Application Data

(60) Provisional application No. 61/689,170, filed on May 29, 2012.

(51) Int. Cl.

| | |
|---|---|
| *H05K 7/02* | (2006.01) |
| *B23P 11/00* | (2006.01) |
| *B23P 17/00* | (2006.01) |
| *H05K 5/02* | (2006.01) |
| *H05K 13/00* | (2006.01) |
| *C25D 11/02* | (2006.01) |
| *C25D 7/00* | (2006.01) |
| *C25D 11/12* | (2006.01) |
| *H05K 5/03* | (2006.01) |
| *H01Q 1/42* | (2006.01) |
| *C25D 11/34* | (2006.01) |
| *H04M 1/02* | (2006.01) |
| *C25D 11/24* | (2006.01) |

(52) U.S. Cl.
CPC .............. *B23P 11/00* (2013.01); *B23P 17/00* (2013.01); *H05K 5/0217* (2013.01); *H05K 13/00* (2013.01); *C25D 11/022* (2013.01); *C25D 7/00* (2013.01); *C25D 11/12* (2013.01); *C25D 11/02* (2013.01); *H05K 5/0247* (2013.01); *H05K 5/03* (2013.01); *H01Q 1/42* (2013.01); *C25D 11/34* (2013.01); *H04M 1/0249* (2013.01); *C25D 11/246* (2013.01)
USPC ........................................ 174/541; 455/575.1

(58) Field of Classification Search
CPC .................................................. H05K 5/0008
USPC ............................ 455/575.1, 575.8; 174/541
See application file for complete search history.

(56) References Cited

U.S. PATENT DOCUMENTS 3,940,786 A * 2/1976 Scheingold et al. .......... 257/773
4,631,631 A * 12/1986 Hodges et al. ............. 361/306.1

(Continued)

FOREIGN PATENT DOCUMENTS

WO 2011126334 10/2011

OTHER PUBLICATIONS

PCT Application No. PCT/US2013/042902—International Search Report and Written Opinion dated Oct. 7, 2013.

*Primary Examiner* — Hung Ngo
(74) *Attorney, Agent, or Firm* — Womble Carlyle Sandridge & Rice LLP

(57) ABSTRACT

Various components of an electronic device housing and methods for their assembly are disclosed. The housing can be formed by assembling and connecting two or more different sections together. The sections of the housing may be coupled together using one or more coupling members. The coupling members may be formed using a two-shot molding process in which the first shot forms a structural portion of the coupling members, and the second shot forms cosmetic portions of the coupling members.

20 Claims, 13 Drawing Sheets

(56) References Cited

U.S. PATENT DOCUMENTS

| | | | |
|---|---|---|---|
| 4,648,125 A * | 3/1987 | Brown .................... | 455/575.1 |
| 5,761,046 A * | 6/1998 | Hein et al. .................... | 361/752 |
| 5,819,163 A * | 10/1998 | Tsukamoto et al. ........ | 455/575.1 |
| 6,275,683 B1 * | 8/2001 | Smith .................... | 455/575.1 |
| 6,305,588 B1 * | 10/2001 | Michel et al. ................ | 224/271 |
| 6,624,432 B1 | 9/2003 | Gabower et al. | |
| 7,627,355 B2 * | 12/2009 | Amano et al. ............. | 455/575.4 |
| 8,004,835 B2 * | 8/2011 | Conti et al. ............. | 361/679.56 |
| 2003/0030989 A1 | 2/2003 | Kitchen et al. | |
| 2007/0049365 A1 * | 3/2007 | Norris et al. ................ | 455/575.8 |
| 2008/0259551 A1 | 10/2008 | Gavenda et al. | |
| 2011/0023287 A1 | 2/2011 | Zadesky et al. | |
| 2011/0084886 A1 * | 4/2011 | Ogatsu et al. ................ | 343/702 |
| 2013/0003267 A1 * | 1/2013 | Pan et al. ................ | 361/679.01 |

* cited by examiner

COMPONENTS OF AN ELECTRONIC DEVICE

CROSS REFERENCE TO RELATED APPLICATIONS

This application claims the benefit of U.S. Provisional Patent Application No. 61/689,170, filed May 29, 2012, which is incorporated by reference herein in its entirety.

FIELD OF THE INVENTION

Various components of an electronic device housing and methods for their assembly are disclosed.

BACKGROUND OF THE DISCLOSURE

Portable electronic devices may be constructed using different approaches. For instance, an electronic device can be constructed by assembling several components together. These "components" can include external components that are combined to form a device enclosure (e.g., a device "housing"), as well as internal components that may provide structural support or other functionality for the electronic device (e.g., coupling members, fasteners, and electronic components). Based on the design of the electronic device, the external and internal components can be formed from any suitable material(s) including metals and plastics.

SUMMARY OF THE DISCLOSURE

Portable electronic devices are disclosed. A portable electronic device may be assembled from a number of internal and external components. In particular, the portable electronic device may include an enclosure assembled from two or more sections physically joined together with coupling members. A cover glass may be coupled to an outside edge of the disclosure, and the cover glass and enclosure, together, can define a volume for retaining the internal components of the electronic device.

According to some embodiments, the sections of the enclosure may be formed from one or more electrically conducting materials. The coupling members may be formed from one or more dielectric, insulating materials, which can electrically isolate the various electrically conductive sections of the enclosure. The coupling members may also span an entire width of the enclosure. Cover plates can be coupled to the coupling members on a side of the electronic device opposing the cover glass.

According to some embodiments, the sections of the enclosure may be formed from separately extruded parts. For example, the enclosure may include a top section, a center section, and a bottom section that are extruded separately and joined together using coupling members. The extruded sections of the enclosure may be assembled such that the longitudinal extrusion axes of one or more of the sections (e.g., the top and bottom sections) are perpendicular to the longitudinal axis of at least one other section (e.g., the center section). Materials and extrusion parameters may be chosen such that the separately extruded sections have a continuous, unibody appearance once they are joined together by the coupling members. In particular, grains in the extruded sections may be minimized or eliminated or appear continuous between the extruded sections of the enclosure.

According to further embodiments, the coupling members may be formed using a two-shot molding process in which the first shot physically couples together two or more of the sections of the enclosure. The sections may include locking members along their edges to facilitate the physical coupling during the first shot. The second shot can form one or more cosmetic structures that may be visible to a user of the electronic device. In some embodiments, the cosmetic structures may be exposed to one or more harsh manufacturing processes and/or chemicals. Accordingly, the cosmetic structures may include materials chosen for their ability to maintain an aesthetically pleasing appearance while withstanding such processing.

According to still further embodiments, one or more peripheral edges of the enclosure may be chamfered or otherwise trimmed for aesthetic and/or tactile purposes. The edge(s) may be trimmed, for example, after the first-shot molding process but before the second-shot molding process.

DETAILED DESCRIPTION OF THE DISCLOSURE

Figure 2:
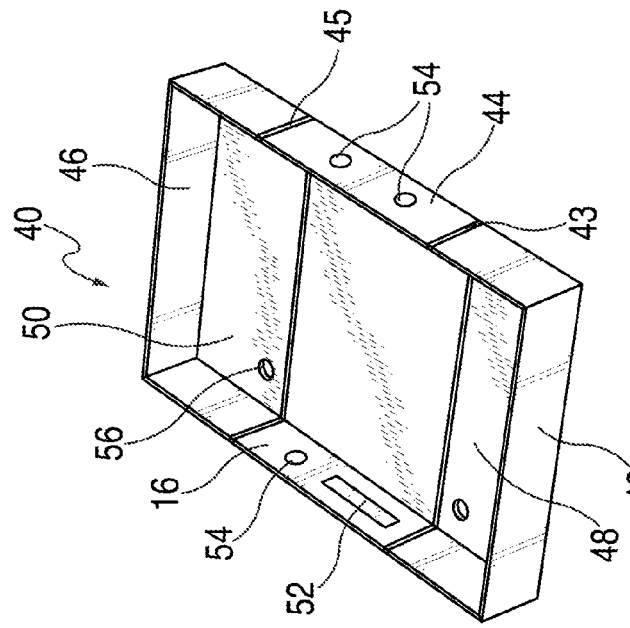
FIG. 2 is a schematic perspective view of a subassembly of a portable electronic device in accordance with some embodiments of the disclosure.

The following disclosure describes various embodiments of electronic devices, such as portable electronic devices including, for example, cellular telephones, and the like. Certain details are set forth in the following description and FIGS. to provide a thorough understanding of various embodiments of the present technology. Moreover, various features, structures, and/or characteristics of the present technology can be combined in other suitable structures and environments. In other instances, well-known structures, materials, operations, and/or systems are not shown or described in detail in the following disclosure to avoid unnecessarily obscuring the description of the various embodiments of the technology. Those of ordinary skill in the art will recognize, however, that the present technology can be practiced without one or more of the details set forth herein, or with other structures, methods, components, and so forth.

The accompanying FIGS. depict several features of embodiments of the present technology and are not intended to be limiting of its scope. Many of the details, dimensions, angles, and other features shown in the Figures are merely illustrative of particular embodiments of the disclosure. Accordingly, other embodiments can have other details, dimensions, angles, and/or features without departing from the spirit or scope of the present disclosure.

An electronic device can include several components assembled together to form internal and/or external features of the electronic device. For example, one or more internal components (e.g., electrical circuitry and/or internal support structures) can be placed within external components (e.g., housing structures) to provide an electronic device having desired functionality. As used herein, the term "component" refers to a distinct entity of an electronic device. Components may include, for example, electronic circuit elements (e.g., a microchip), one or more members forming the housing of the electronic device (e.g., a backplate or an outer periphery component), and internal support structures (e.g., a midplate).

In some cases, a component can be manufactured by assembling and connecting two or more different individual elements (i.e., "sections") together. As used herein, the term "section" can refer to an individual portion of a component, where that component may be formed from multiple sections. The various sections of the component may then be coupled together using a "coupling member." For example, the electronic device may include an enclosure component assembled from two or more sections, which are joined together with one or more coupling members.

Based on the desired functionality and design of the component and its sections, these coupling members can exhibit a wide range of shapes and structures. For example, the coupling members can include structural elements that can reinforce areas of high mechanical strain, counteract twisting movements at areas of high torsion, interlock two sections together such that they are mechanically coupled together, provide electrical isolation between two or more sections, and the like.

Figure 1:
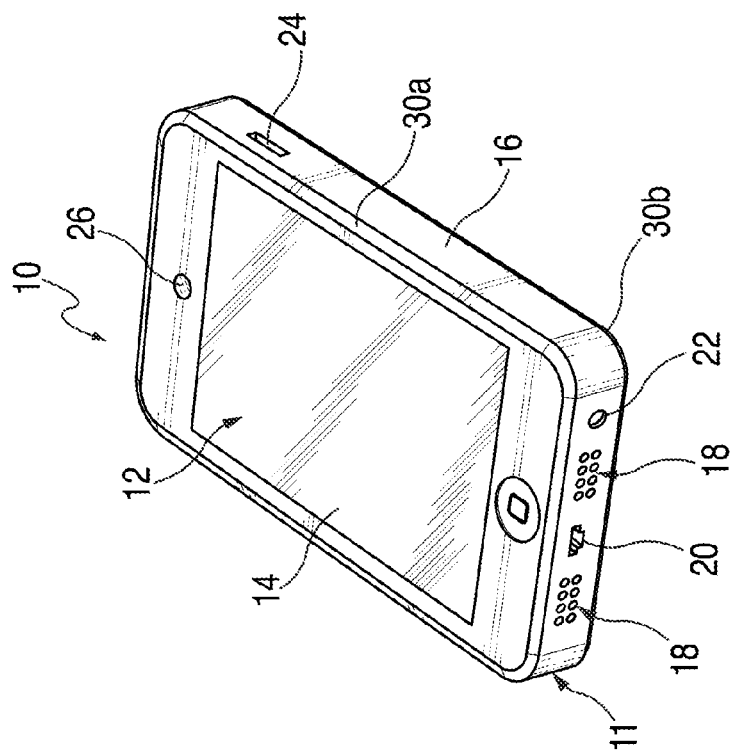
FIG. 1 is a schematic perspective view of a portable electronic device configured in accordance with an embodiment of the disclosure.

FIG. 1 is a schematic perspective view of an electronic device 10. Electronic device 10 may be any one of a number of electronic devices including, but not limited to, cellular telephones, smartphones, other wireless communication devices, personal digital assistants, audio players, video players, game players, other media players, music recorders, video recorders, cameras, other media recorders, radios, medical devices, vehicle transportation instruments, calculators, programmable remote controls, pagers, laptop computers, desktop computers, printers, and combinations thereof. In some cases, electronic device 10 may perform multiple functions (e.g. play music, display video, store pictures, and receive and transmit telephone calls).

In the illustrated embodiment, electronic device 10 includes a body 11 incorporating a display 12. Display 12 can include a cover or cover glass 14 that is operably coupled to a frame, housing, or enclosure 16. In certain embodiments, display 12 may allow a user to interact with or control electronic device 10. For example, display 12 and/or cover glass 14 can include touch-sensitive features to receive input commands from a user. In various embodiments, a cover or cover glass can encompass most of the surface area (e.g., 50%-100%) of one side of electronic device 10 (as shown in FIG. 1), and a cover or cover plates can be positioned on an opposing side of electronic device 10 (not shown). As described in detail below, enclosure 16 and the cover glass 14 can at least partially house or enclose several internal components of the electronic device. According to some embodiments, cover glass 14 may be made from a glass (e.g., a pigmented or non-pigmented aluminosilicate glass) or other suitable material (e.g., sapphire).

In the embodiment illustrated in FIG. 1, enclosure 16 also at least partially defines several additional features of the electronic device 10. In particular, the enclosure 16 can include audible speaker outlets 18, a connector opening 20, an audio jack opening 22, a card opening 24 (e.g., SIM card opening), a front facing camera 26. Though not shown in FIG. 1, enclosure 16 may also include a rear facing camera, a power button, and one or more volume buttons. Although FIG. 1 schematically illustrates several of these features, one of ordinary skill in the art will appreciate that the relative size and location of these features can vary.

In certain embodiments, enclosure 16 can be made from a metallic material. For example, enclosure 16 can be made from aluminum or an aluminum alloy such as 6063 Aluminum. In other embodiments, however, enclosure 16 can be made from other materials, including suitable metals, alloys, and/or plastics.

As shown in FIG. 1, enclosure 16 can include opposing edge portions 30 (identified individually as a first edge portion 30a and a second edge portion 30b) extending around a periphery of the body 11. In certain embodiments, one or both of edge portions 30 can have a chamfered, beveled, or other suitably shaped profile. As described in detail below, edge portions 30 may be formed to provide an aesthetically appealing appearance for enclosure 16.

According to some embodiments, the exterior surface of enclosure 16 can be exposed to a first treatment, edge portions 30 may be formed, and the exterior surface of enclosure 16, including edge portions 30, can be exposed to a second treatment. In one embodiment, for example, a first anodization process can be applied to enclosure 16 before edge portions 30 are chamfered, and a second subsequent anodization process can be applied to enclosure 16 after edge portions 30 have been chamfered. Additional suitable surface treatments, including intermediary surface treatments, can be applied to enclosure 16 and/or edge portions 30. In still further embodiments, edge portions 30 can have other suitable profiles or shapes including and/or surface treatments.

According to some embodiments, the anodization processes referred to above can be similar to those disclosed in co-pending U.S. Ser. No. 13/332,288, filed Dec. 20, 2011, entitled "METAL SURFACE AND PROCESS FOR TREATING A METAL SURFACE," which is incorporated by reference herein in its entirety. In some embodiments, the anodization processes can be similar to those disclosed in U.S. patent application Ser. No. 13/610,813, filed Sep. 11, 2012, entitled, "DOUBLE ANODIZING PROCESSES," the disclosure of which is incorporated by reference herein in its entirety. For example, the processes can include applying a mask to a portion of a metal surface (e.g., a portion of enclosure 16) using a photolithographic process. After the mask is applied, the metal surface can be exposed to one or more texturizing processes, including machining, brushing, blasting, or chemically etching the surface.

Further, the metal surface can be exposed to an anodization process, which can convert a portion of the metal surface into a metal oxide for increased corrosion resistance, wear resistance, and or to obtain a desired cosmetic effect (e.g., colorization via absorption of dyes or metals). The anodization process may be performed before or after the photolithographic mask is removed. In some embodiments, a first photolithographic mask can be removed and a second photolithographic mask can be applied before performing the anodization process. In still further embodiments, and as described above, the metal surface may be exposed to more than one anodization process. One or more finishing processes (e.g., polishing or sealing) may also be performed on the metal surface. In some embodiments, a first portion of the housing may be exposed to a first anodization process and a second portion of the housing may be exposed to a second anodization process.

FIG. 2 is a schematic perspective view of a subassembly 40 of electronic device 10 of FIG. 1. In the embodiment illustrated in FIG. 2, subassembly 40 includes enclosure 16 coupled to a cover glass, such as the cover glass 14 shown in FIG. 1. As shown in FIG. 2, enclosure 16 can include a first enclosure section 42 coupled to a second enclosure section 44, which is in turn coupled to a third enclosure section 46. Additionally, enclosure 16 can include a first coupling member 48 that couples first enclosure section 42 to second enclosure section 44 at a first interface 43. Enclosure 16 can also include a second coupling member 50 that couples second enclosure section 44 to third enclosure section 46 at a second interface 45. As assembled, subassembly 40 forms a five-sided structure, or tub, that can be enclosed on its sixth side by cover glass 14.

In certain embodiments, the first, second, and third enclosure sections 42, 44, and 46 can be metallic, and the first and second coupling members 48 and 50 can be made from one or more plastic materials. As described below in detail, for example, each of the first and second coupling members 48 and 50 can be formed from a two-shot molding process that may include a first plastic portion that joins the corresponding enclosure portions and a second cosmetic plastic portion that at least partially covers the first plastic portions. As further described in detail below, these plastic portions can be configured to withstand harsh chemicals and manufacturing processes (e.g., the texturizing and anodization processes described above) that may be used to form and process the enclosure. In further embodiments, the enclosure sections 42, 44, and 46 and/or the first and second coupling members 48 and 50 can be made from any suitable materials including metallic, plastic, and/or other materials.

According to additional features of the embodiment illustrated in FIG. 2, enclosure 16 can include conductive portion 52 (shown schematically) for grounding purposes. In some embodiments, conductive portion 52 can comprise one or more conductive portions. Conductive portion 52 can be formed by removing one or more layers or portions of the enclosure 16 to provide a lower resistance through enclosure 16 for antenna transmissions or communications. In certain embodiments, for example, the conductive portion 52 can be formed by laser etching or otherwise removing or etching an anodized portion of enclosure 16. The exposed surfaces of conductive portion 52 can then be chemically treated to retain its electrical conductivity. Examples of suitable chemical treatment include chromate and non-chromate conversion coatings to passivate conductive portion 52. These coatings can be applied using techniques including spraying and brushing using a paint brush. The conductivity of conductive portion 52, as well as through different portions of enclosure 16, can be tested using suitable techniques such as using resistance using probes at different points of conductive portion 52 and enclosure 16 to assure that ground can be established though enclosure 16.

The illustrated subassembly 40 also includes several inserts 54 that can provide increased structural support and functionality for enclosure 16. In embodiments in which the enclosure 16 is formed from aluminum, for example, inserts 54 can increase strength and durability of enclosure 16 by providing mounting points for structural and/or functional internal components. Additionally, in certain embodiments, inserts 54 can include threaded inserts or nuts that are configured to threadably engage a corresponding fastener. Inserts 54 formed from titanium may be advantageous as titanium can withstand harsh manufacturing processes and chemicals to which subassembly 40 may be subjected. In other embodiments, however, inserts 54 can be made from other suitable materials including, for example, steel, stainless steel, or brass.

According to yet additional features of the subassembly 40 not visible in FIG. 2, but described in detail below with respect to FIGS. 10, 11, and 15, cover plates can be securely coupled, and offset if desired, relative to one side of the five-sided enclosure 16. In particular, the cover plates can be aligned with a reference plane or datum relative to enclosure 16. In order to maintain tight tolerance between the cover plates and enclosure sections 42, 44, and 46, enclosure 16 can include one or more access openings 56 that may be used to urge or bias the cover plates relative to the enclosure 16 for secure attachment (e.g., an adhesive attachment). For example, one or more springs may be inserted through access openings 56 to bias the cover plates against a planar structure until an applied adhesive sets.

Figure 3:
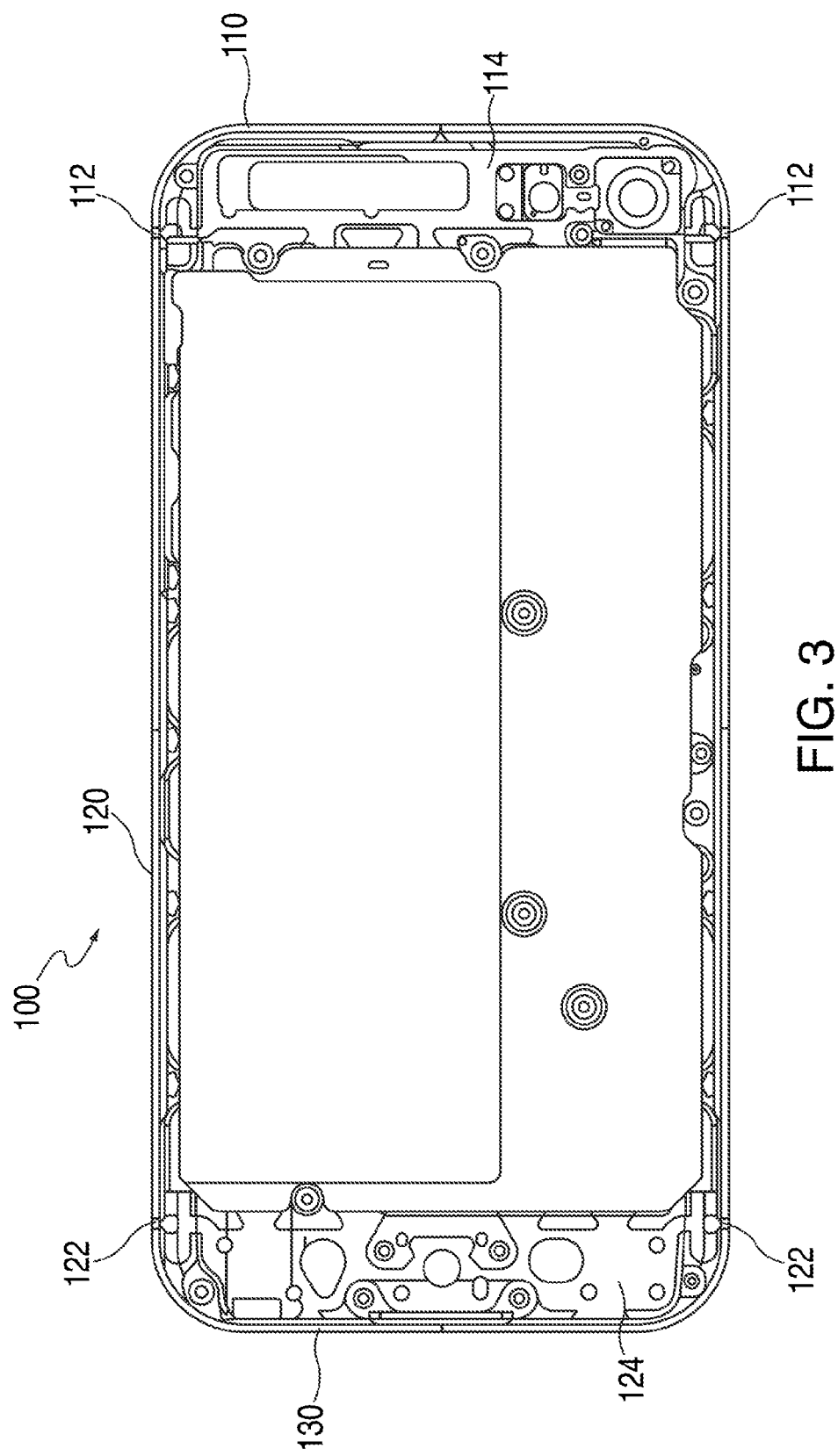
FIG. 3 shows a top view of an of an outer periphery component of an electronic device in accordance with some embodiments.

FIG. 3 shows a top view of an of an outer periphery component 100 of an electronic device in accordance with some embodiments. In particular, FIG. 3 shows a view of outer periphery component 100, which may be assembled from sections 110, 120, and 130. Outer periphery component 100 may generally represent a more detailed view of subassembly 40 of FIG. 2. For example, top section 110, center section 120, and bottom section 130 may correspond to first enclosure section 42, second enclosure section 44, and third enclosure section 46, respectively. Outer periphery component 100 can be constructed to form an exterior, peripheral surface for an electronic device. In particular, outer periphery component 100 can surround or enclose some or all of the internal components (e.g., electronic circuits, internal support structures, and the like) of the electronic device. In other words, outer periphery component 100 can define an internal volume into which internal components can be placed.

The thickness, length, height, and cross-section of outer periphery component 100 may be selected based on any suitable criteria including, for example, structural requirements (e.g., stiffness or resistance to bending, compression, and tension or torsion in particular orientations). In some embodiments, outer periphery component 100 can serve as a structural member to which other electronic device components can be mounted. Some of the structural integrity of outer periphery component 100 can come from the closed shape that it defines (e.g., outer periphery component 100 forms a loop, thus providing structural integrity).

Outer periphery component 100 can have any suitably shaped cross-section. For example, outer periphery component 100 can have a substantially rectangular cross-section. Each corner of the substantially rectangular cross-section can be chamfered or rounded in shape, thus forming a "spline." As used herein, the term "spline" refers to a rounded corner portion of an outer periphery component. In some embodiments, outer periphery component 100 can have a cross-section in any other suitable shape including, for example, a circular shape, an oval shape, a polygonal shape, or a curved shape. In some embodiments, the shape or size of the cross-section of outer periphery component 100 can vary along the length or width of the electronic device (e.g., an hourglass shaped cross-section). The spline may be formed by trimming one or more edges of outer periphery component 100 as described in detail below with respect to FIG. 4.

Outer periphery component 100 of the electronic device can be constructed using any suitable process. In some embodiments, outer periphery component 100 can be constructed by connecting top section 110 and center section 120 together at interface 112, and connecting center section 120 and bottom section 130 together at interface 122. Although outer periphery component 100 is illustrated in FIG. 3 as being constructed from three sections, one skilled in the art could appreciate that outer periphery component 100 could alternatively be formed from any suitable number of two or more sections, and that the interfaces between the sections may be positioned at any location on outer periphery component 100.

Each section 110, 120, and 130 can be constructed individually and later assembled to form outer periphery component 100. For example, each section can be individually constructed using one or more of stamping, machining, working, casting, extrusion, or any combinations of these. In some embodiments, the materials selected for sections 110, 120, and 130 can be conductive, thus allowing the sections to provide an electrical functionality for the electronic device. For example, sections 110, 120, and 130 can be formed from a conductive material such as stainless steel or aluminum. In one particular embodiment, sections 110, 120, and 130 may be constructed from 6063 Aluminum. In some embodiments, each section may serve as an antenna for the electronic device.

To mechanically couple individual sections together, coupling members 114 and 124 can exist at interfaces 112 and 122, respectively. In some embodiments, each of the coupling members can be constructed from a material that can begin in a first state and may subsequently change to a second state. As an illustration, the coupling members can be constructed from a plastic that begins in a first, liquid state and then subsequently changes to a second, solid state. For example, the coupling members may be formed using one or more injection molding processes.

In some embodiments, the coupling member can be constructed from a glass-filled polyethylene terephthalate ("PET"). Alternatively, the coupling member can be constructed from a high-strength plastic such as polyaryletherketone ("PAEK") or polyether ether ketone ("PEEK"). While in the liquid state, the plastic can be allowed to flow into interfaces 112 and 122. After flowing into these interfaces, the plastic material may subsequently be allowed to harden into coupling members 114 and 124 (e.g., the plastic material is allowed to change into the second, solid state). Upon changing into the solid state, the plastic material may then physically bond top section 110 to center section 120 along a first edge of center section 120, and center section 120 and bottom section 130 along a second edge of center section 120, thus forming a single new component (e.g., outer periphery component 100).

Coupling members 114 and 124 not only physically couple together sections 110 and 120, and sections 120 and 130; they may also electrically isolate top section 110 from center section 120, and center section 120 from bottom section 130. As will be explained in more detail below, coupling members 114 and 124 may include locking structures that are attached to integrally formed parts of sections 110, 120, and 130. That is, when the coupling member is in its first state (e.g., the liquid state), it can flow into and/or around the locking structures of section 110, 120, and/or 130. A shutoff device (e.g., an insert mold, not shown) may be positioned at each interface to shape the coupling member for when it transforms into its second state (e.g., the solid state).

Coupling members 114 and 124 can be constructed to span a width of outer periphery component 100, as shown in FIG. 3. A portion of the coupling members 114 and 124 can interface with locking members existing on the sidewalls of sections 110, 120, and 130, and other portions of coupling members 114 and 124 can interface with additional locking members existing on the edge of the sections. In some embodiments, the physical coupling between coupling members 114 and 124 and sections 110, 120, and 130 may be reinforced with one or more fasteners.

Figure 4:
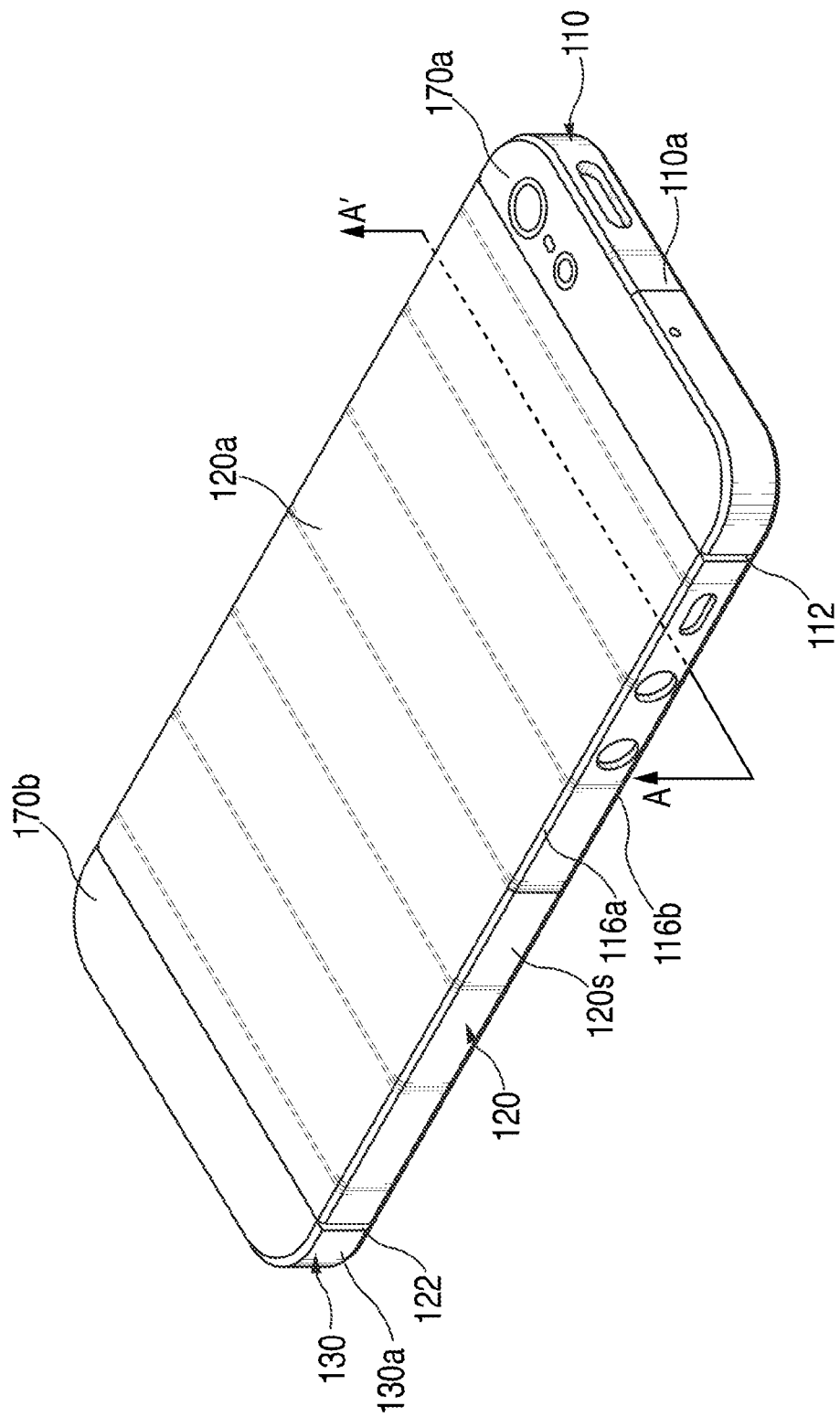
FIG. 4 shows a perspective view of the back side of an outer periphery component in accordance with some embodiments.

FIG. 4 shows a perspective view of the back side of outer periphery component 100 in accordance with some embodiments. Outer periphery component can include top section 110, center section 120, bottom section 130, and interfaces 112 and 122. As can be seen in FIG. 4, center section 120 can form three sides of the five-sided outer periphery component 100, which can form a tub shape. The three sides of center section 120 can include a planar region 120a, a first sidewall 120s, and a second sidewall (not visible). The sidewalls may extend perpendicularly from planar region 120a.

Top section 110 and bottom section 130 can each be U-shaped members that include outer surfaces 110a and 130a, respectively. Top section 110 and bottom section 130 can also include inner surfaces (not shown). As assembled into outer periphery component 100, a plane co-planar with planar region 120a of section 120 can be perpendicular to any plane that is co-planar with outer surfaces 110a and 130a of sections 110 and 130.

Also visible in FIG. 4 are cover plates 170a and 170b, which will be discussed in more detail below with respect to FIGS. 10 and 11. Cover plates 170a and 170b may be coupled to outer periphery component 100 such that outer surfaces 171a and 171b are flush with an outer surface of at least one side of outer periphery component 100 (e.g., an outer surface of center section 120). Cover plates 170a and 170b may each encompass any suitable surface area on the side of outer periphery component 100 (e.g., 1% to 50%).

Outer periphery component 100 can also include chamfered edges 116a and 116b. As noted above, chamfered edges can have any suitable shape (e.g., chamfer, round, or ogee), thus giving outer periphery component 100 any suitable cross-sectional shape. Chamfered edges 116a and 116b may be aesthetically and tactilely pleasing features for outer periphery component 100.

According to some embodiments, chamfered edges 116a and 116b may be formed after one or more molding processes that are used to create one or more coupling members 114 and 124. For example, top section 110 and center section 120 may be coupled together with coupling member 114 at interface 112. Excess material from the molding of the coupling members that extends beyond the outer surface of outer periphery component 100 may be ground down, and outer periphery component 100 can be exposed to one or more finishing processes (e.g., anodization, texturization, or polishing).

One or more sections of the coupling members may then be machined to ready outer periphery component 100 for a second molding process, which can form cosmetic outward facing components for the coupling members. Excess material from the second molding process may be removed (e.g., ground down), and then chamfered edges 116a and 116b can be machined, trimmed, ground, or otherwise processed to produce a desired edge profile (e.g., a chamfered edge profile). For example, the excess material from the second molding process may be removed in a co-finishing process such that the material is flush with chamfered edges 116a and 116b, planar region 120a, first sidewall 120s (and the second sidewall, not visible), and outer surfaces 110a and 130a of sections 110 and 130, respectively. After chamfered edges 116a and 116b are formed, outer periphery component 100 may be exposed to one or more additional finishing processes (e.g., a second anodization process).

Figure 5:
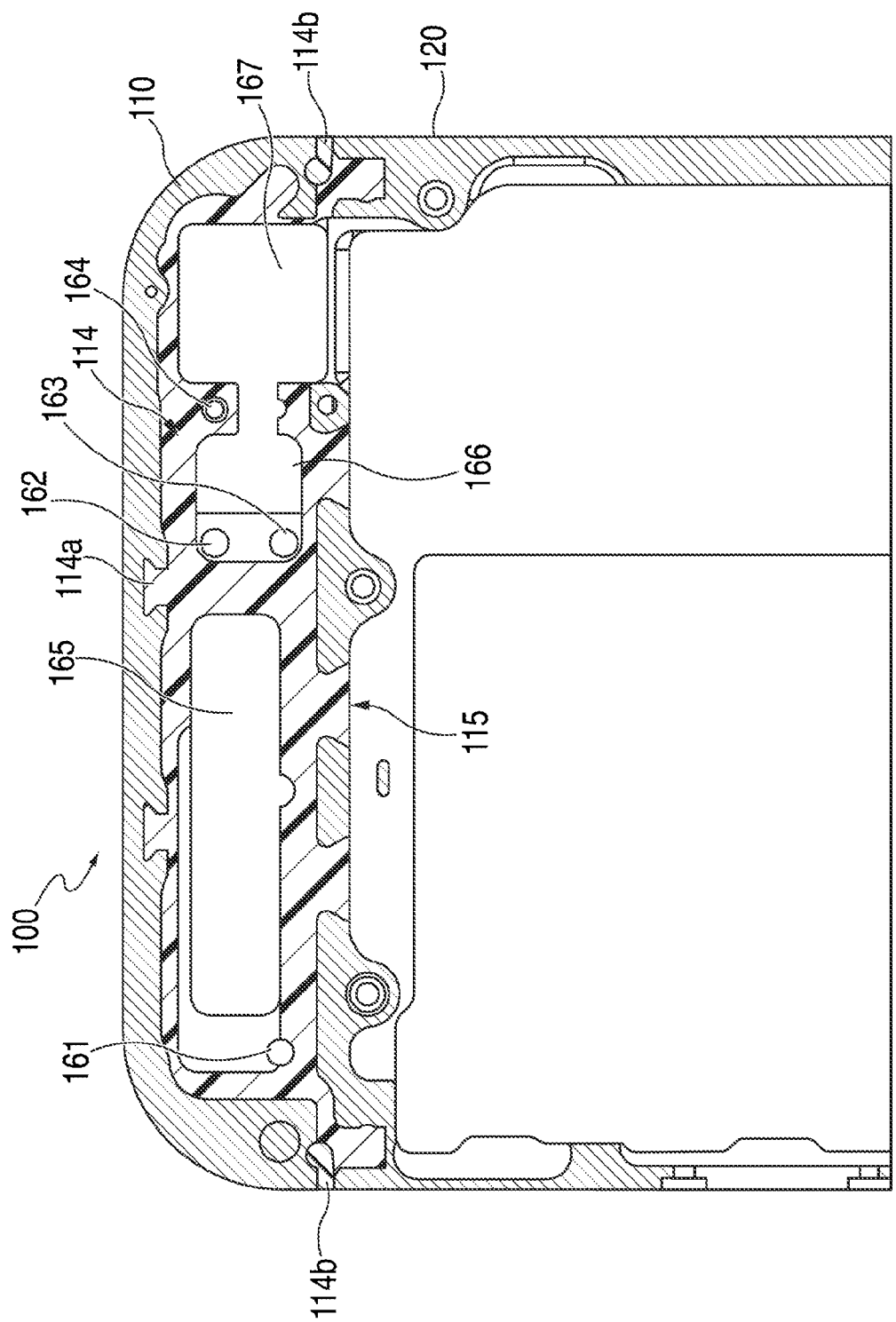
FIG. 5 shows a detailed cross-sectional view of an outer periphery component in accordance with some embodiments.

FIG. 5 shows detailed cross-sectional view of a portion of outer periphery component 100 taken along line A-A' of FIG. 4. In particular, FIG. 5 shows a cross-sectional view of of coupling member 114, top section 110, and a portion of center section 120 of outer periphery component 100. Coupling member 114 (and coupling member 124, which is not shown in this detailed view of outer periphery component 100) can be constructed to include a first-shot component 114a and a second-shot component 114b.

Coupling members 114 and 124 (not shown) can be exposed to various physically and chemically harsh environments during the manufacturing process. For example, the side walls and back plate of an electronic device can undergo polishing or lapping operations, which can involve the use of very acidic (around pH 2) and/or very alkali (around pH 8-9) slurries depending on whether the polishing is a fine or rough polishing procedure. In addition, during a photolithography process, the device can be exposed to UV light during UV curing stage and developing stage, as well as exposure to a strong base such as sodium hydroxide for rinsing away non-cured photoresist material. Furthermore, during an anodizing process, the device can be subjected to a variety of acidic and alkali solutions at elevated temperatures and for extended amounts of time, as described above with reference to anodizing techniques. If a blasting, or other texturizing, procedure is used, the plastic material can be exposed to a pressurized blasting media. Additionally, during de-masking (used to remove photoresist material) the device can be exposed to acidic or alkali rinses solutions at elevated temperatures. Moreover, during a CNC the device can be exposed to cutting fluids. The first shot and second shot materials can be unaffected by one or more of the above described processes in that they can maintain structural integrity and can appear substantially unmarred. It should be noted that in some embodiments a mask can be used to prevent degradation of portions of plastic during some of the processes described above. For example, a mask can be used to protect plastic during higher intensity UV exposure during photolithography and during certain CNC steps to protect the plastic surface from scratching. Any suitable mask to protect the plastic can be used. In one embodiment, a UV curable polymer mask is used.

In embodiments described herein the materials used to form coupling members 114 and 124, can be configured to withstand some or all the above described physical and chemical conditions. First-shot component 114a and second-shot component 114b can be made of different materials to serve different functions. In some embodiments, the first-shot component 114a can be formed from a relatively stronger material so as to provide structural support for the electronic device and second-shot component 114b can be formed from a softer but more cosmetically appealing material for aesthetic purposes. In certain embodiments, both first-shot component 114a and second-shot component 114b can be configured to withstand some or all of the above described physical and chemical conditions. For example, first-shot component 114a and second-shot component 114b can be formed from a high mechanical strength thermoplastic polymer resin such as a glass-filled PAEK or PEEK material. In other embodiments a glass-filled PET material can be used. In preferred embodiments, second-shot component 114b can appear smooth and even, thereby providing a more cosmetically appealing appearance than first-shot component 114a. In some cases, the second-shot component 114b can take on any of a number of colors.

First-shot component 114a can be responsible for physically coupling together the sections (e.g., section 110 and section 120) of outer periphery component 100 and can be machined to include retaining regions for receiving the second shot. Second-shot component 114b can function as a cosmetic component that is self-anchored within the retaining region of first-shot component 114a. Second-shot component 114b may be the only part of coupling member 114 that is visible to the user when the device is fully assembled. Because second-shot component 114b may be visible and exposed to the environment, including during one or more harsh processing steps, it can be formed from a material suitable for maintaining an aesthetically pleasing appearance (e.g., polyether imide ("PEI")) notwithstanding such processing. Additionally, second-shot component 114b can have any suitable color.

According to some embodiments, first-shot component 114a can be injection molded between top section 110 and center section 120. In particular, top section 110 and center section 120 can be inserted into an injection mold (not shown), and the material for forming first-shot component 114a can be injected into the mold cavity. In some embodiments, the injection mold may define one or more features and/or boundaries of first-shot component 114a, including one or more of elements 161-167 and/or coupling member edge 115. Alternatively, elements 161-167 and/or coupling member edge 115 can be formed (e.g., by grinding, machining, or otherwise trimming first-shot component 114a) after the material has cooled and set.

Coupling member 114 (and coupling member 124, not shown) may be machined, for example, to have holes, recesses, retention features, or any other desired features after it is applied as a first shot. Such machined features are illustratively shown as elements 161-167. For example, elements 161-164 are holes, and elements 165-167 are rectangular cutouts. These machine features may enable cables to pass from one side of the coupling member to another or to enable secure placement of various components such as a button, a camera, a microphone, a speaker, an audio jack, a receiver, a connector assembly, or the like. Additionally, one or more of elements 161-164 can be an antenna window via which an antenna can radiate and/or receive signals.

Figure 6:
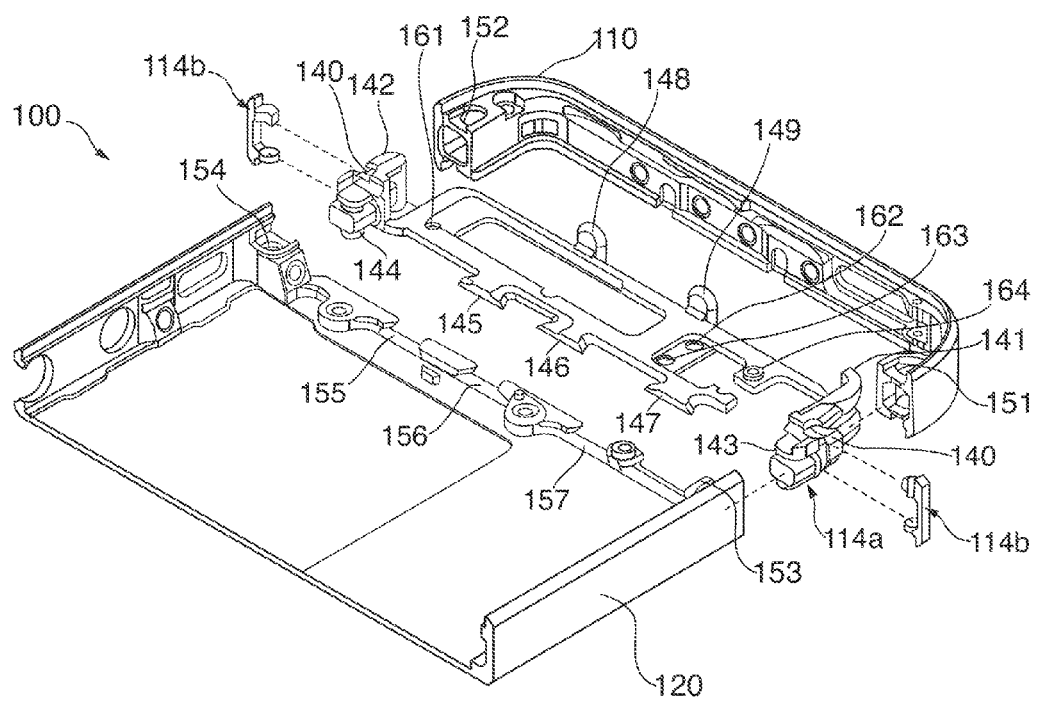
FIG. 6 shows an exploded view of the detailed view of the outer periphery component shown in FIG. 5 in accordance with some embodiments.

FIG. 6 shows an exploded view of the detailed view of coupling member 114, top section 110, and center section 120 of outer periphery component 100 shown in FIG. 5. First-shot component 114a can include interface features 141-147 for interfacing with locking mechanisms 151-159 of sections 110 and 120. According to some embodiments, interface features 141-147 may be formed during a first-shot injection molding process in which the material that forms first-shot component 114a fills the interstices that define locking mechanisms 151-159 of sections 110 and 120.

According to some embodiments, coupling member 114 can interface with sidewall locking mechanisms 151-154 and edge locking mechanisms 155-157 with sidewall interface features 141-144 and edge interface features 145-147, respectively. In some embodiments, sidewall interface features 141-144 can be referred to as "knuckles." In particular, sidewall interface features 141 and 143 can form a first knuckle, and sidewall interface features 142 and 144 can form a second knuckle. Edge interface features, on the other hand can be formed on a "span" of coupling member 114, which extends between the two knuckles. When coupling member 114 is applied in a liquid state (e.g., into an injection mold), it can flow into and/or around locking mechanisms 151-157. When the material sets and turns into a solid as coupling member 114, it can form a physical interconnect that couples sections 110 and 120 together. Coupling member 114 can include fastener through-holes 148 and 149 that line up with holes and or inserts in section 110 such that screws or other fasteners can be used to secure coupling member 114 to section 110.

First-shot component 114a may also include second-shot cavities 140 for receiving second-shot components 114b. Second-shot cavities 140 may form recesses in first-shot component 114a at the interfaces between section 110 and section 120 (as well as section 120 and section 130, not shown). According to some embodiments, second-shot cavities 140 may be formed after first-shot component 114a has been formed. In particular, portions of first-shot component 114a can be removed (e.g., by sawing, drilling, or machining) to form the recesses for second-shot cavities 140.

Portions of sections 110 and 120 abutting first-shot component 114a may also be removed when forming second-shot cavities 140. For example, second-shot cavities 140 can be created by sawing material away from first-shot component 114a, section 110, and section 120 at the interfaces between sections 110 and 120. Accordingly, the width of second-shot cavities 140 can be repeated with accuracy, as the width is determined solely by the kerf of the saw. Accuracy and repeatability in the formation of second-shot cavities 140 may be advantageous for a number of reasons including, for example, antenna performance and aesthetic considerations. In some embodiments, a relatively small amount (e.g., 0.05-0.15 mm) of material may be removed from each of sections 110 and 120 during the formation of second-shot cavities 140.

Both second-shot cavities 140 may be formed at the same time. In particular, in embodiments in which second-shot cavities 140 are formed by sawing first-shot component 114a, and/or portions of sections 110 and 120, second-shot cavities 140 can be cut together. Additionally, the same cut that forms second-shot cavities 140 can remove material from section 120 across the width of outer periphery component 100 between the second-shot cavities 140. Accordingly, a straight, clean edge can be formed at the edge of section 120, resulting in excellent alignment between the various components of outer periphery component 100.

In further embodiments, second-shot cavities 140 may be formed as first-shot component 114a is molded (e.g., using features included in the injection mold). Second-shot components 114b may be purely cosmetic and configured to withstand harsh processing and/or chemicals while maintaining an attractive outward aesthetic.

In still further embodiments, coupling member 114 may include only first-shot component 114a, with second-shot component 114b being formed integrally with first-shot component 114a. That is, coupling member 114 may be formed from a one-shot molding process, and the material that forms first-shot component 114a may be visible from the outside of outer periphery component 100. These embodiments may be preferable, for example, if the material used to form first-shot component 114a is aesthetically pleasing even after exposure to one or more harsh chemicals and/or processes.

Figure 7:
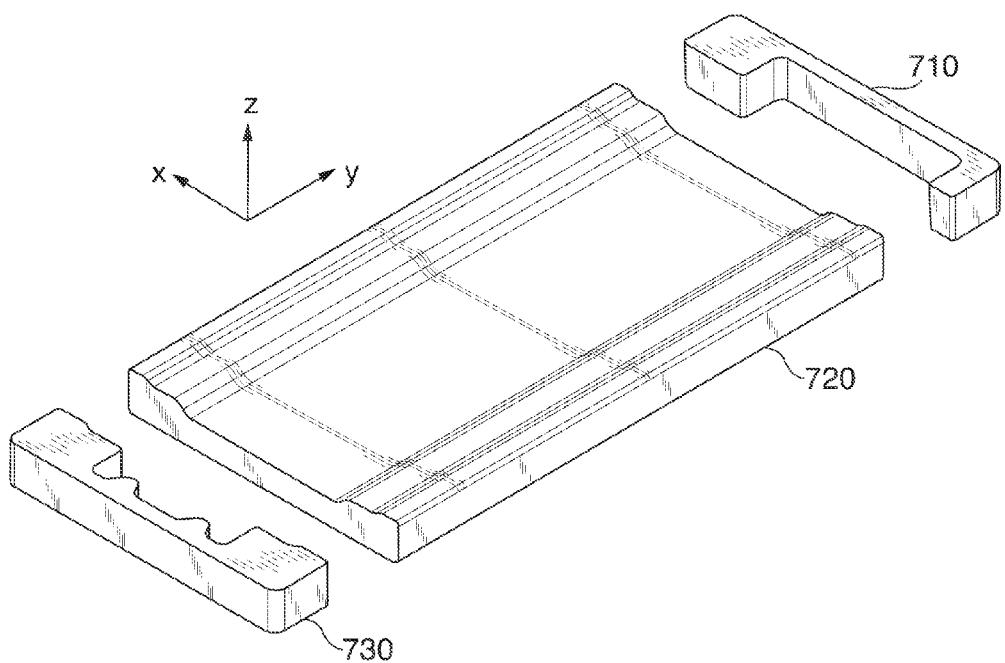
FIG. 7 shows a perspective view of extruded sections of an electronic device housing in accordance with some embodiments.

FIG. 7 shows a perspective view of extruded sections 710, 720, and 730 of an electronic device housing in accordance with some embodiments. Extruded sections 710, 720, and 730 may be cut from extruded parts that are later machined to form sections 110, 120, and 130, as discussed above. In some embodiments, extruded sections 710, 720, and 730 can be extruded separately in order to simplify the machining processes that will form sections 110, 120, and 130. Alternatively, two or more of extruded sections 710, 720, and 730 may be cut from the same extruded part and cut to size (e.g., the relative sizes shown in FIG. 7). For example, top extruded section 710 and bottom extruded section 730 may both be cut from the same extruded part. In some embodiments, one or more of extruded sections 710, 720, or 730 may be bent during or after extrusion.

According to some embodiments, extruded sections 710, 720, and 730 may be assembled such that the longitudinal extrusion axis (i.e., the axis along which the section was extruded) of at least one of the sections (e.g., top extruded section 710 and bottom extruded section 730) is perpendicular to the longitudinal extrusion axis of at least one other section (e.g., center extruded section 720). For example, the longitudinal extrusion axes of top extruded section 710 and bottom extruded section 730 may be parallel to the z-axis, while the longitudinal extrusion axis of center extruded section 720 may be parallel to the y-axis. One or more of extruded sections 710, 720, and 730 may be oriented differently in order to facilitate machining of extruded sections 710, 720, and 730 into, for example, sections 110, 120, and 130. For example, it may be difficult or impossible to form the five-sided tub structure of outer periphery component 100 of from a single extruded part or multiple extruded parts oriented along the same longitudinal extrusion axis.

One consequence of orienting one or more sections along different longitudinal extrusion axes is that visible grains, which are typical byproducts of extrusion processes, may not match between adjacent sections of the assembled electronic device. Accordingly, the materials and extrusion parameters used to form extruded sections 710, 720, and 730, as well as the final orientations of the sections, may be optimized to minimize the appearance of grain boundaries between adjacent sections. As just one example, extruded sections 710, 720, and 730 may be formed from a material that is not susceptible to forming visual stretch marks during the extrusion process (e.g., 6063 Aluminum). Accordingly, extruded sections 710, 720, and 730 may appear to have a smooth, continuous, unibody aesthetic after the extruded sections are machined and assembled. In particular, the five-sided outer periphery component 100, which can be assembled from sections 110, 120, and 130, may appear to be one continuous, unibody component.

Assembling an electronic device housing from separate extruded sections (e.g., extruded sections 710, 720, and 730) can be advantageous in several respects. For example, forming sections of an electronic device housing from extruded parts can be a cost effective and environmentally friendly alternative to conventional methods (e.g., die casting or molding) as the extrusion process can create long lengths of extruded parts that cut to appropriate lengths without excessive waste. Additionally, the availability of separately extruded sections can allow for the formation of detailed locking features (e.g., edge locking mechanisms 155-157 and sidewall locking mechanisms 151-154 of FIG. 6 and retention holes 860 of FIG. 8), which may not be possible if the housing is formed from a single molded part.

Figure 8:
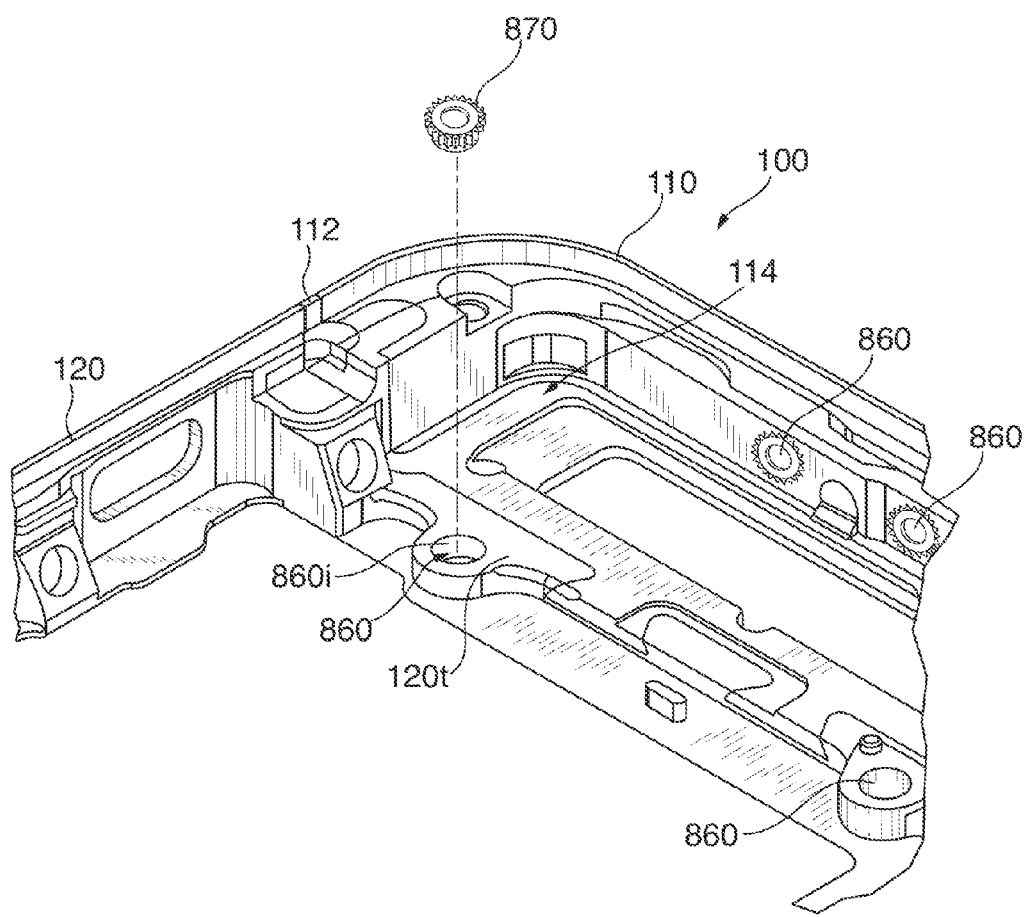
FIG. 8 shows a perspective view of a portion of sections of an electronic device housing in accordance with some embodiments.

FIG. 8 shows a perspective view of a portion of outer periphery component 100 of an electronic device including one or more retention holes 860 formed therethrough in accordance with some embodiments. As shown in FIG. 8, one or more of section 120, coupling member 114, and section 110 may include one or more retention holes 860 formed therethrough (or partially therethrough). For example, retention holes 860 may be machined or otherwise formed through the material of center section 120 between a top surface 120t and a bottom surface 120b (not shown) of section 120. Alternatively, retention holes 860 may extend only partially into the section 120 without reaching or extending through bottom surface 120b.

In some embodiments, section 120 can be made from aluminum or an aluminum alloy (e.g., 6063 Aluminum), which may not be suitable for forming threads for receiving a screw. Therefore, the interior surface 860i of retention holes 860 may be substantially continuous and smooth, and thus may not be suitable for receiving and retaining a screw mechanism. A threaded insert 870 may be positioned within and retained by retention hole 860 such that a screw mechanism may be threadably retained within a portion of outer periphery component 100.

Figure 9B:
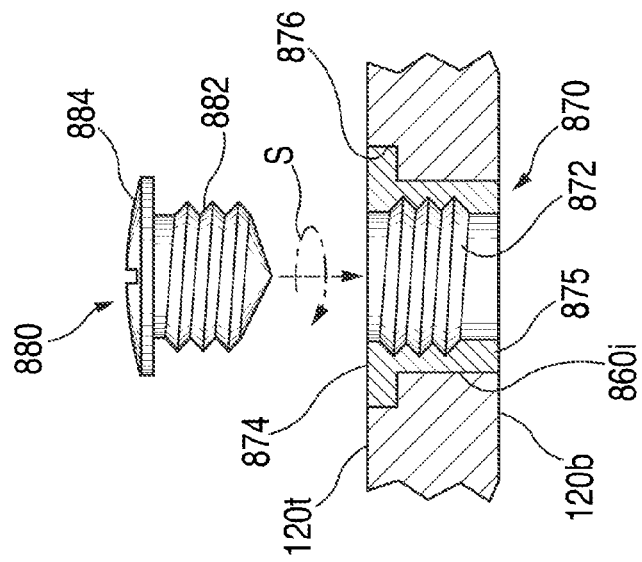
FIGS. 9A and 9B show a threaded insert positionable within retention hole 860, which can include one or more elements for receiving a fastener in accordance with some embodiments.
Figure 9A:
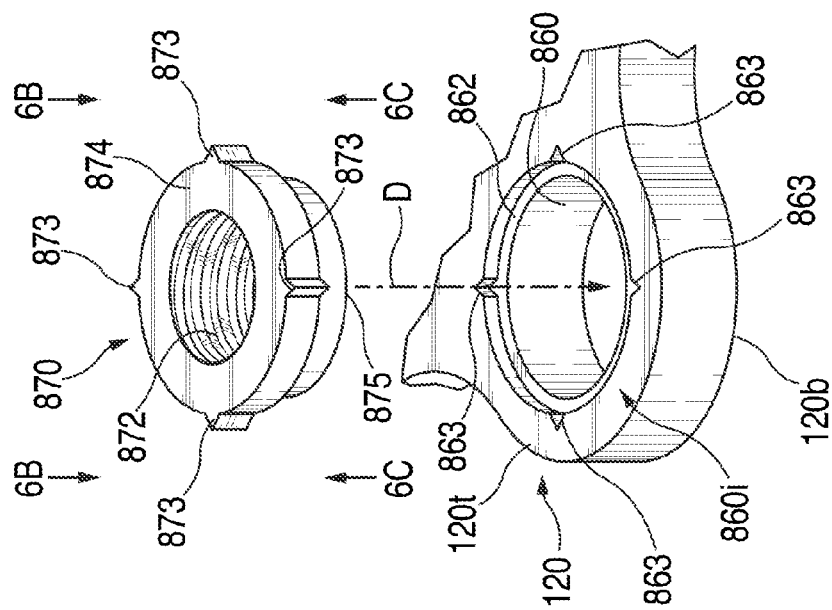

As shown in FIGS. 9A and 9B, a threaded insert 870 may be positioned within retention hole 860. Threaded insert 870 can include one or more elements for receiving a fastener. For example, threaded insert 870 can include threads 872 for receiving and retaining a screw 880. Threaded insert 870 may be made of any material (e.g., titanium) suitable for receiving and gripping screw 880 and withstanding harsh chemicals and/or processes (e.g., texturization and/or anodization).

Titanium may be particularly suitable for threaded insert 870, because while titanium can anodize under the conditions used for anodizing aluminum, it will anodize only minimally and create little film growth. Thus, the titanium inserts will remain conductive and therefore suitable for electrical grounding, for example, even after undergoing an aluminum anodizing process. In addition, since anodization will occur minimally on titanium, the geometry of any threaded regions of the inserts may remain substantially the same. It should be noted that in addition to titanium, other suitable hard metals materials can be used for the threaded insert 870, including magnesium, zinc, tantalum, or hard aluminum alloys such as 7075 Aluminum. Inserts made of softer aluminum alloys can be used, however the softer aluminum inserts may anodize in the aluminum anodizing bath. Therefore, in order to keep the aluminum inserts electrically conductive and to retain any threaded geometry, it can be necessary to mask the aluminum inserts using, for example polymer plugs, prior to exposure to the anodizing bath. However, this masking process can add time, cost, and manual labor to the process.

Threaded insert 870 may include a cap 874 that may be coupled to a body 875. In some embodiments, cap 874 and body 875 can be integrally formed. The external surfaces of threaded insert 870 may be sized and shaped similarly to the size and shape of the internal surfaces of retention hole 860 such that threaded insert 870 can be positioned within retention hole 860. For example, threaded insert 870 may be press fit into retention hole 860 (e.g., in the direction of arrow D). In some embodiments, an adhesive may be used to retain threaded insert 870 within retention hole 860.

In some embodiments, at least a portion of cap 874 may have a larger cross-sectional area than a portion of body 875. A top portion 862 of retention hole 860 may be larger than the remainder of retention hole 860, such that top portion 862 may receive cap 874 and prevent cap 874 from being passed through the remainder of retention hole 860. Moreover, cap 874 may include one or more protrusions 873 that may be received by one or more complimentary notches 863 in top portion 862 of retention hole 860. When each protrusion 873 of cap 874 is aligned with and positioned within a respective notch 863 in top portion 862 of retention hole 860, the interaction of each protrusion 873 and notch 863 may prevent threaded insert 870 from rotating with respect to retention hole 860 (e.g., in the direction of arrow S).

Threaded insert 870 may also include a threaded hollow 876 that may extend through at least a portion of cap 874 and/or through at least a portion of body 875. The interior surface of threaded hollow 876 may include one or more threads 872 that may receive and retain complimentary threads 882 of a screw 880 that is rotated down into threaded hollow 876 (e.g., in the direction of arrow S). As mentioned, due to the interaction of each protrusion 873 and notch 863, threaded insert 870 may be prevented from rotating within retention hole 860 in the direction of arrow S while screw 880 may be rotated within threaded hollow 876 of threaded insert 870 in the direction of arrow S. By positioning threaded insert 870 within retention hole 860 (e.g., of section 120) screw 880 may be screwed into and at least partially retained by threaded insert 870 within retention hole 860 such that screw 880 can couple section 120 (via threaded insert 870) to another component of the electronic device assembly (not shown).

Figure 10:
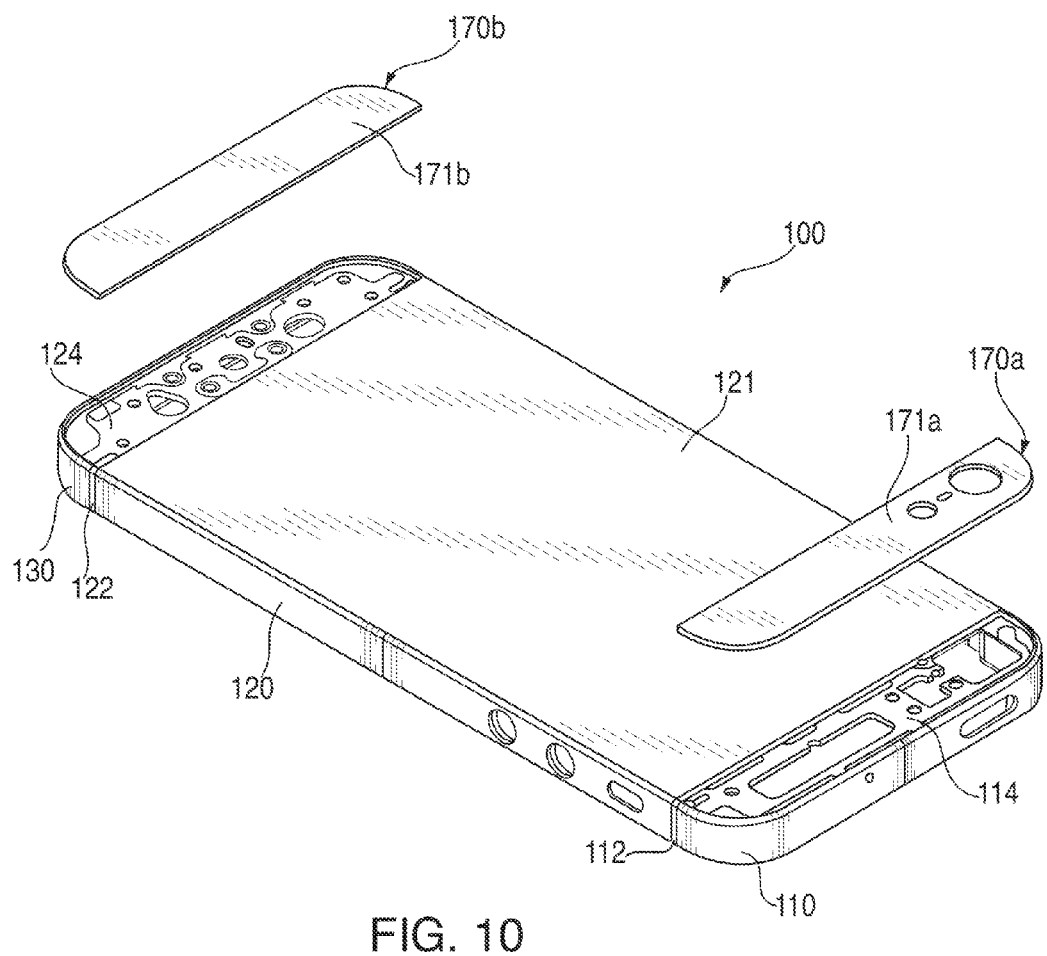
FIG. 10 shows a perspective view of an outer periphery component including cover plates in accordance with some embodiments.

FIG. 10 shows a perspective view of outer periphery component 100 including cover plates 170a and 170b. After coupling members 114 and 124 have coupled top section 110 to center section 120 and center section 120 to bottom section 130, respectively, cover plates 170a and 170b may be coupled to a bottom side of coupling members 114 and 124, respectively. Cover plates 170a and 170b may be formed from any suitable material or combination of materials (e.g., pigmented glass, white ceramic glass, or sapphire) that may protect one or more components positioned within outer periphery component 100. The material that forms cover plates 170a and 170b may be chosen for having a number of desirable qualities, including high strength, stiffness, and hardness or scratch resistance, transparency to radio frequencies, and/or opaqueness to visible light. The material also may be chosen based on aesthetic considerations (e.g., whether the color of the cover plate coordinates well with other colors of the electronic device incorporating outer periphery component 100 that are visible to a user).

According to some embodiments, cover plates 170a and 170b may be formed from a pigmented glass (e.g., pigmented aluminosilicate glass). The pigmented glass may be opaque to visible light in order to hide one or more internal components housed within outer periphery component 100 including, for example, coupling members 114 and 124. In these embodiments, the pigmented glass can be treated with one or more processes to improve its hardness and stiffness. For example, the pigmented glass can be exposed to a potassium nitrate bath, which can initiate an ion exchange process that strengthens the glass.

Additionally, one or both sides of cover plates 170a and 170b (e.g., outer surfaces 171a and 171b and/or their respective opposing sides) formed from pigmented glass may be painted. Painting one or both sides of cover plates 170a and 170b with a dark paint can ensure that the cover plates are, indeed, opaque and add consistency between cover plates manufactured in different batches, lots, plants, etc. Cover plates 170a and 170b may be formed from pigmented glass in order to match dark colored features included elsewhere in outer periphery component 100 and/or the finished electronic device (e.g., electronic device 10 of FIG. 1).

According to some further embodiments, cover plates 170a and 170b may be formed from a ceramic glass material. A base glass for forming the ceramic glass may be a glass (e.g., aluminosilicate glass) with several nucleation sites disposed throughout. The nucleation sites may be formed from any suitable impurity introduced into the base glass. The base glass can then be transformed into ceramic glass by exposure to one or more temperature cycling processes (e.g., raising and lowering the temperature of the base glass), which can promote crystal formation around the nucleation sites, thus forming the ceramic glass. In some embodiments, the ceramic glass may be an opaque, light colored (e.g., white, off white, or light gray) material. In these embodiments, the ceramic glass can be treated with one or more processes to improve its hardness and stiffness. For example, the ceramic glass can be exposed to a sodium nitrate bath, which can initiate an ion exchange process that strengthens the glass.

As with the pigmented glass, one or both sides of cover plates 170a and 170b formed from ceramic glass may be painted. Painting one or both sides of cover plates 170a and 170b with a light (e.g., white, off white, or gray) paint can ensure that the cover plates are opaque and add consistency between cover plates manufactured in different batches, lots, plants, etc. Cover plates 170a and 170b may be formed from ceramic glass in order to match light colored features included elsewhere in outer periphery component 100 and/or the finished electronic device (e.g., electronic device 10 of FIG. 1).

According to still further embodiments, although they may be opaque to visible light frequencies (e.g., 390-750 THz), cover plates 170a and 170b may be transparent to light at frequencies (e.g., 500-6500 MHz) used for wireless communication. Accordingly, cover plates 170a and 170b may be used as antenna windows that allow antennas disposed proximate thereto to radiate and receive wireless signals.

According to some embodiments, cover plates 170a and 170b can be sliced to the appropriate thickness and cut to the appropriate lateral dimensions for incorporation into outer periphery component 100. Cover plates 170a and 170b may also be exposed to one or more polishing steps (e.g., before and/or after the sodium or potassium nitrate strengthening baths).

Furthermore, it may be aesthetically and tactilely advantageous for outer surfaces 171a and 171b of cover plates 170a and 170b to be flush with outer surface 121 of section 120. Accordingly, to ensure that outer periphery component 100 has a smooth and continuous outer surface, one or more springs or biasing mechanisms may be provided through coupling members 114 and 124 for supporting cover plates 170a and 170b with respect to coupling members 114 and 124 while an adhesive is allowed to set. The adhesive can adhere cover plates 170a and 170b to coupling members 114 and 124, for example.

Figure 11:
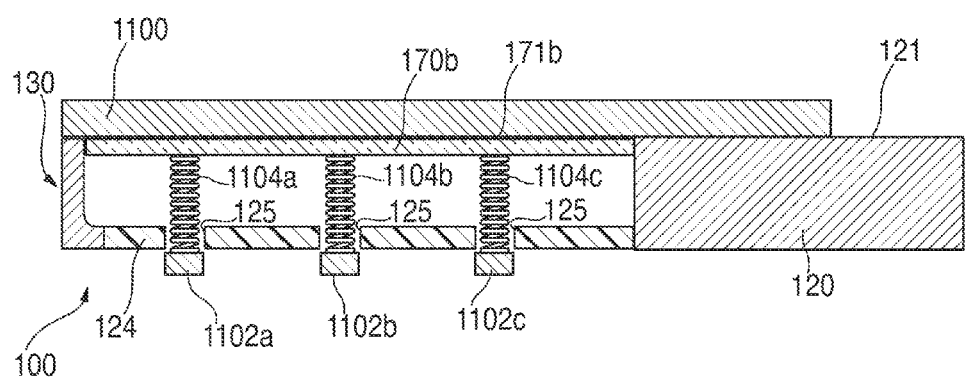
FIG. 11 shows a cross-sectional view of biasing mechanisms passed through holes in a coupling member towards the underside of a cover plate to bias cover plate against a flat datum surface in accordance with some embodiments.

As shown in FIG. 11, one or more springs or biasing mechanisms 1104 (e.g., 1104a-c) may be passed through holes 125 in coupling member 124 towards the underside of cover plate 170b to bias cover plate 170b against a flat datum surface 1100. Outer surface 121 of section 120 may also be held against flat datum surface 1100. According to some embodiments, each biasing mechanism may be independently controlled by its own biasing module 1102 (e.g., 1102a-c) such that different portions of cover plate 170b may be biased with different biasing forces against flat datum surface 1100 for ensuring that all portions of outer surface 171b of cover plate 170b may be flush or in a continuous plane with outer surface 121 of section 120 while an adhesive (not shown) is allowed to dry. The adhesive may secure cover plate 170b to coupling member 124 and/or section 120 and/or section 130.

Figure 12:
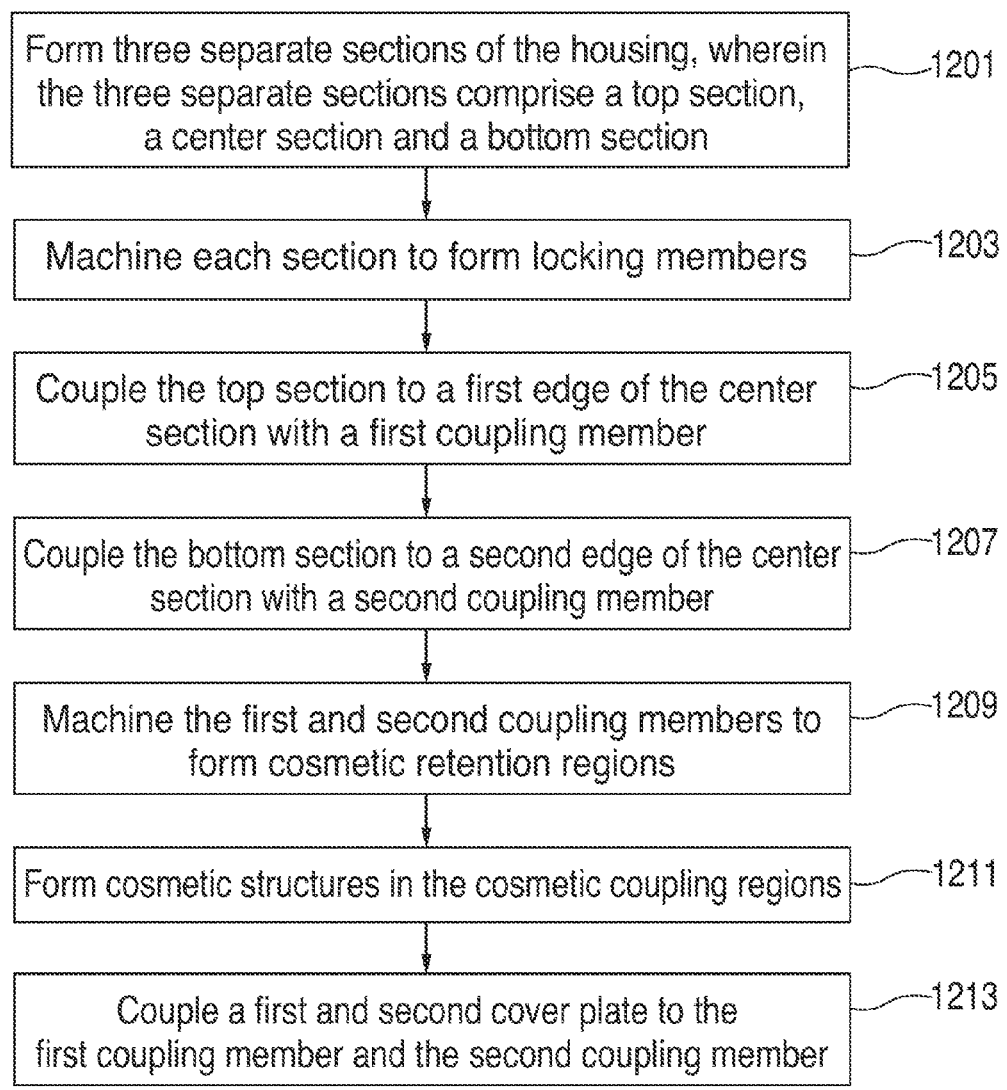
FIGS. 12-15 show illustrative processes for creating a housing for an electronic device in accordance with some embodiments.

FIG. 12 shows an illustrative process 1200 for creating a housing for an electronic device in accordance with some embodiments. Beginning at step 1201, three separate sections of a housing can be formed. The three separate sections can include a top section, a center section, and a bottom section. According to some embodiments, the three separate sections may be extruded along a longitudinal extrusion axis and cut to the appropriate length (e.g., the lengths of extruded sections 710, 720, and 730 of FIG. 7). The three separate sections may be formed from a metallic material (e.g., aluminum, 6063 Aluminum, stainless steel, or any other suitable metal or alloy). One skilled in the art will appreciate that the housing for the electronic device may be assembled from any suitable number of sections (e.g., 2-5).

At step 1203, each extruded section can be machined to include locking members and/or other suitable features. The locking members can be formed along one or more edges (e.g., edge locking mechanisms 155-157 of FIG. 6) and/or sidewalls (e.g., sidewall locking mechanisms 151-154 of FIG. 5) of each section. According to some embodiments, each extruded section may also be machined to reduce the thickness of the walls of the extruded sections. The walls of each extruded section may be machined to a thickness that will optimize the interior volume of the electronic device assembled from the sections while retaining suitable structural integrity.

At step 1205, a first section is coupled to a second section with a first coupling member. Similarly, at step 1207, the second section can be coupled to a third section with a second coupling member. For example, as shown in FIG. 3, top section 110 can be coupled to center section 120 with coupling member 114, and center section 120 can be coupled to bottom section 130 with coupling member 124. According to some embodiments, the coupling members can be formed at the same time (e.g., during a first-shot injection molding process). Accordingly, the three separate sections can be set within a mold, and the injection molding material (e.g., a suitable liquid plastic material such as PAEK or PEEK) can be injected into the mold. The injection molding material may be permitted to flow into one or more of the locking members of the sections and allowed to set, physically coupling the sections together. As an alternative, each of the coupling members can be formed separately.

At step 1209, the first and second coupling members can be machined to form cosmetic cavities. Because the first and second coupling members may be responsible for adding structural support to the electronic device housing, the material that forms the coupling members may be chosen primarily for its strength. Accordingly, aesthetic considerations may be a secondary concern for the coupling members. However, as part of the coupling members may be visible on the exterior of the electronic device (e.g., at interfaces 112 and 122 of FIG. 4), the portions of the coupling members that will be visible can be machined to create cosmetic cavities, (e.g., cavities suitable for receiving second-shot molded members). The second-shot material may be chosen primarily for its aesthetic qualities.

At step 1211, cosmetic structures can be formed in the cosmetic cavities. According to some embodiments, the cosmetic structures may be formed in the cosmetic cavities using a second-shot injection molding process. As the cosmetic structures may be visible from the exterior of the electronic device, a suitable material (e.g., PEI) may be chosen for its ability to maintain a pleasing aesthetic appearance even after exposure to one or more harsh chemicals (e.g., sulfuric acid and nitric acid) and/or processes (e.g., UV light exposure and anodization). After the cosmetic structures are formed, one or more grinding or sanding processes may shape the cosmetic structures such that they are flush with the outer surfaces of the housing.

At step 1213, first and second cover plates (e.g., cover plates 170a and 170b of FIG. 10) can be fixed to the first and second coupling members, respectively. The first and second cover plates may be affixed to the first and second coupling members such that outer surfaces of the cover plates are co-planer with at least one outer surface of one of the sections (e.g., outer surface 121 of section 120). Alternatively, the cover plates may be offset by a desired distance from the datum surface defined by an outer surface of one of the sections.

According to some embodiments, one or more edges of the housing may be machined, trimmed, or otherwise altered to form an aesthetically and tactilely pleasing profile. For example, opposing edge portions 30 of FIG. 1 can be machined to create chamfered edges. According to some embodiments, the edges can be machined after the cosmetic structures are formed at step 1211. For instance, after the cosmetic structures are molded and shaped as described above, the edges of the housing (and portions of the cosmetic structures) can be machined to form a desired edge profile (e.g., a chamfered edge profile). After the edges are machined, the housing may be exposed to one or more finishing processes (e.g., anodization). Accordingly, both the material that forms the housing (e.g., 6063 Aluminum) and the material that forms the cosmetic structures (e.g., PEI) may be chosen to withstand, and maintain a pleasing external appearance, through the finishing processes.

Figure 13:
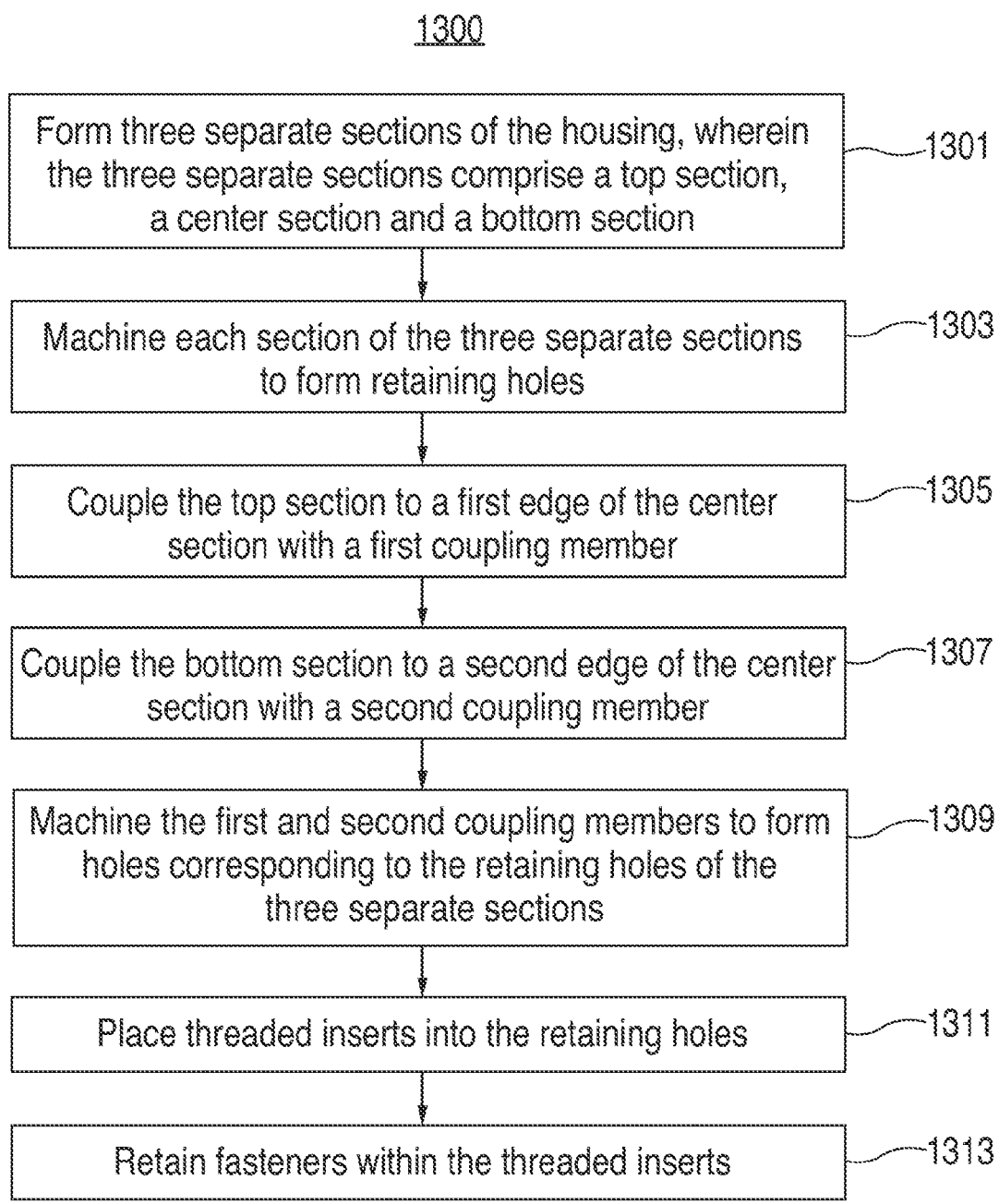

FIG. 13 shows an illustrative process 1300 for creating a housing for an electronic device in accordance with some embodiments. Beginning at step 1301, three separate sections of a housing can be formed. The three separate sections can include a top section, a center section, and a bottom section. According to some embodiments, the three separate sections may be extruded along a longitudinal extrusion axis and cut to the appropriate length (e.g., the lengths of extruded sections 710, 720, and 730 of FIG. 7). The three separate sections may be formed from a metallic material (e.g., aluminum, 6063 Aluminum, stainless steel, or any other suitable metal or alloy). One skilled in the art will appreciate that the housing for the electronic device may be assembled from any suitable number of sections (e.g., 2-5).

At step 1303, at least one section can be machined to include retention holes (e.g., retention holes 860 of FIG. 8). The retention holes may extend from a top surface of a section through a bottom surface (e.g., top surface 120t and bottom surface 120b of section 120 of FIG. 9A). Alternatively, the retention holes may extend through the top surface of the section without reaching the bottom surface.

At step 1305, a first section can coupled to a second section with a first coupling member. Similarly, at step 1307, the second section can be coupled to a third section with a second coupling member. For example, steps 1305 and 1307 may substantially correspond to steps 1205 and 1207 as described above with respect to FIG. 12.

At step 1309, the first and second coupling members can be machined to form holes corresponding to the retention holes of the at least one section. In particular, holes can be formed in the first and second coupling members at points where the coupling members overlap retention holes that were formed at step 1303. In some embodiments, step 1303 may be omitted, and retention holes can be formed in at least on section and through the coupling members simultaneously (e.g., in step 1309). According to certain embodiments, a top section of the retention holes may be larger than the remainder of the retention holes. Furthermore, one or more notches may be formed in the top sections of the retention holes.

At step 1311, threaded inserts (e.g., threaded insert 870 of FIG. 9A) may be placed into the retention holes. The threaded inserts may have outer dimensions that correspond to the dimensions of the retention holes. For example, if the retention holes include top sections with wider cross-sectional areas than the remainder of the retention holes, the threaded inserts may have include a cap (e.g., cap 874 of FIG. 9A) with a cross-sectional area corresponding to the top sections of the retention holes and a body (e.g., body 875 of FIG. 9A) with a cross-sectional area corresponding to the remainder of the retention holes. According to some embodiments, the cap of the threaded insert can include one or more protrusions (e.g., protrusions 873 of FIG. 9A) that correspond to notches in the top sections of the retention holes.

The threaded inserts may include a threaded hollow (e.g., threaded hollow 876) that may extend through at least a portion of the cap and/or through at least a portion of the body. The interior surface of the threaded hollow may include one or more threads (e.g., threads 872 of FIG. 9A) that may receive and retain complimentary threads of a screw (e.g., threads 882 of screw 880 of FIG. 9B) that can be rotated down into the threaded hollow. In some embodiments the threaded inserts may be formed from a metal (e.g., titanium). Accordingly to some embodiments, the threaded inserts may be press fit into the retention holes and/or affixed within the retention holes using an adhesive.

At step 1313, fasteners (e.g., screws) may be retained within the threaded inserts. The fasteners may be used to mount or otherwise couple one or more internal components of the electronic device to the sections of the housing. For example, one or more circuit boards, structural reinforcing members, cameras, and/or other suitable internal components may be mounted within the electronic device housing assembled from the sections.

Figure 14:
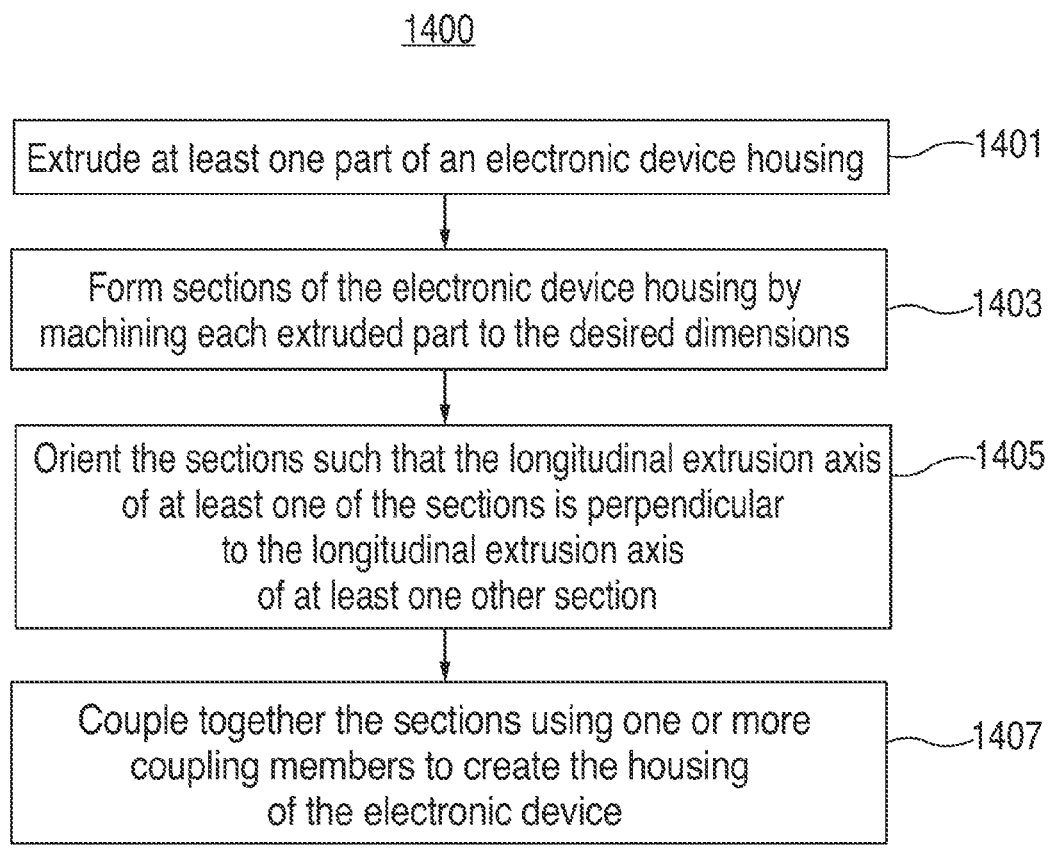

FIG. 14 shows an illustrative process 1400 for creating a housing for an electronic device in accordance with some embodiments. At step 1401, at least one section of the housing can be extruded. According to some embodiments, a single member can be extruded along a longitudinal extrusion axis cut to lengths appropriate for the sections of the housing of the electronic device. For example, extruded sections 710, 720, and 730 of FIG. 7 may be cut from a single extruded member. In other embodiments, any of the sections of the housing can be extruded separately. For example, extruded sections 710, 720, and 730 can each extruded separately and cut to length or extruded sections 710 and 730 may be cut from the same extruded member and center extruded section 720 may be extruded separately.

The sections may be formed from any suitable material (e.g., aluminum, 6063 Aluminum, stainless steel, or plastic). According to some embodiments, however, the material and various extrusion parameters (e.g., extrusion rate, temperature, etc.) may be chosen to minimize the appearance of any stretch marks or grains resulting from the extrusion process. For example, 6063 Aluminum may be chosen for the material. Accordingly, when the sections are joined together, the housing can appear to be of a seamless, unibody construction without noticeable grain boundaries between the sections.

At step 1403, each extruded part can be machined to the desired dimensions of the housing. For example, the extruded parts can be machined to form sections 110, 120, and 130 of FIG. 3. In particular, the thickness of the each extruded part can be machined to a thickness that can optimize the interior volume of the electronic device housing assembled from the sections while retaining suitable structural integrity. Other features may also be formed in the extruded parts at step 1403, including one or more retention holes (e.g., retention holes 860 of FIG. 8) and/or locking members (e.g., locking members 151-157 of FIG. 6).

According to some embodiments, steps 1401 and 1403 may be combined. In particular, a single member can be extruded along a longitudinal extrusion axis and machined to form the desired dimensions of the housing. For example, a single member in the shape of a rectangular prism may be extruded and then material can be removed (e.g., by machining) to form the housing. The housing can be a five-walled, tub shaped housing with a rectangular, planar surface and four sidewalls extending perpendicularly from the rectangular, planar surface as depicted schematically in FIG. 2, for example. In some embodiments, the single member can be cut into individual sections (e.g., sections 710, 720, and 730) before or after machining. Furthermore, additional material may be removed from one or more of the sections to form a window in the rectangular, planar surface.

At step 1405, the sections can be rotated such that the longitudinal extrusion axis of at least one of the sections is oriented perpendicular to the longitudinal extrusion axis of at least one other section. For example, the longitudinal extrusion axes of two of the sections (e.g., top section 110 and bottom section 130) may be oriented perpendicular to the longitudinal extrusion axis of a third section (e.g., center section 120 of FIG. 3).

At step 1407, the sections can be physically coupled together using one or more coupling members to create the housing of the electronic device. This step may be substantially similar to those described in steps 1205 and 1207 of FIG. 12.

Figure 15:
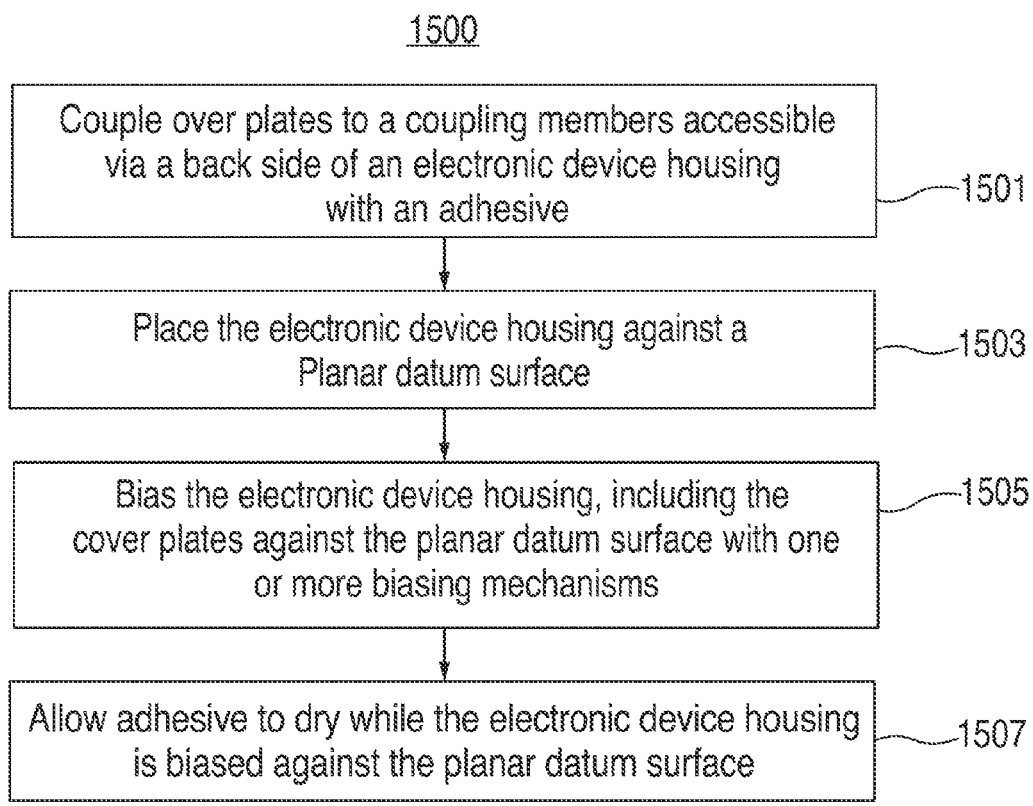

FIG. 15 shows an illustrative process 1500 for creating a housing for an electronic device in accordance with some embodiments. At step 1501, cover plates can be coupled to coupling members accessible via a back side of an electronic device housing. For example, cover plates 170*a* and 170*b* can be coupled to coupling members 114 and 124, respectively, of outer periphery component 100 of FIG. 10. According to some embodiments, the cover plates can be coupled to the electronic device housing with an adhesive (e.g., an epoxy).

At step 1503, the electronic device housing can be placed against a planar datum surface. For example, to ensure that the outer surfaces of the cover plates are flush with an outer surface of the electronic device housing (e.g., outer surfaces of 171*a* and 171*b* of cover plates 170*a* and 170*b* are flush with outer surface 121 of section 120 of FIG. 10), the outer surfaces can be placed against a planar datum surface (e.g., flat datum surface 1100 of FIG. 11). The planar datum surface can be any flat surface external to the electronic device.

At step 1505, the electronic device housing, including the cover plates, can be biased against the planar datum surface with one or more biasing mechanisms. For example, the electronic device can be biased against the planar datum surface with any suitable external force (e.g., a biasing mechanism such as a spring or gravity). Additionally, the cover plates can be biased against the planar datum surface with one or more biasing mechanisms (e.g., springs). The biasing mechanisms (e.g., biasing mechanisms 1104*a-c*) may be passed through holes (e.g., holes 125 in coupling member 124) towards the underside of the cover plates to the cover plates against the flat datum surface 1100. According to some embodiments, each biasing mechanism can be separately controlled by a biasing module (e.g., biasing modules 1102*a-c*) such that different portions of the cover plates may be biased with different biasing forces against the flat datum surface to ensure that the outer surfaces of the cover plates and the outer surface of the electronic device are flush. At step 1507, the adhesive may be allowed to dry while the electronic device housing is biased against the planar datum surface.

It should be understood that the processes described above are merely illustrative. Any of the steps may be removed, modified, or combined, and any additional steps may be added or steps may be performed in different orders, without departing from the scope of the invention.

The described embodiments of the invention are presented for the purpose of illustration and not of limitation.

What is claimed is:

1. A system for retaining components of an electronic device within a housing that comprises housing sections coupled together with coupling members, the system comprising:
    a plurality of retention holes formed in at least one section of the housing;
    a plurality of threaded inserts, wherein a threaded insert is retained within each of the plurality of retention holes, wherein each threaded insert comprises a hollow, threaded core; and
    a plurality of fasteners for coupling internal components of the electronic device to the housing, wherein at least one fastener couples an internal component to a threaded insert.

2. The system of claim 1, wherein the threaded inserts comprise at least one of titanium, 7075 Aluminum, zinc, tantalum, and magnesium.

3. The system of claim 1, wherein the housing sections comprise at least one of:
    6063 Aluminum;
    aluminum; and
    stainless steel.

4. The system of claim 1, wherein the coupling members comprise machined features for retaining one or more internal components of the electronic device.

5. The system of claim 4, wherein the machined features comprise a plurality of through holes in locations corresponding to retention holes of the plurality of retention holes.

6. The system of claim 5, wherein the coupling members are physically coupled to the housing via fasteners inserted through the through holes and into the threaded inserts of the retention holes.

7. The system of claim 1, further comprising an adhesive that retains the threaded inserts in the plurality of retention holes.

8. The system of claim 1, wherein the threaded inserts comprise a body section and a cap section, and wherein the cap section has a larger cross-sectional dimension than the body section.

9. The system of claim 8, wherein a top portion of the plurality of retention holes has a larger cross sectional dimension than a bottom portion of the plurality of retention holes to prevent the cap section of the threaded inserts from passing through the plurality of retention holes.

10. The system of claim 8, wherein the cap section of the threaded inserts comprise protrusions that are received by complementary notches in the plurality of retention holes to prevent the threaded inserts from rotating within the plurality of retention holes.

11. The system of claim 1, wherein the coupling members overlap the plurality of retention holes, and wherein the coupling members comprise holes corresponding to locations of the plurality of retention holes.

12. A portable electronic device, comprising:
    a device housing, comprising a plurality of housing sections coupled together to define both an interior volume within which a plurality of internal components are secured and a retention hole;

a threaded insert disposed within the retention hole, the threaded insert defining a hollow, threaded core; and a fastener that secures one of the plurality of internal components to the device housing by engaging the hollow, threaded core of the threaded insert.

13. The portable electronic device as recited in claim 12, further comprising:

a dielectric coupling member that couples at least two of the plurality of housing sections together and electrically insulates the plurality of housing sections from each other.

14. The portable electronic device as recited in claim 13, wherein the coupling member is formed by injecting molding material between the two of the plurality of housing sections.

15. The portable electronic device as recited in claim 14, wherein the coupling member is secured to at least one of the two of the plurality of housing sections by way of a plurality of edge locking mechanisms defined by the housing section.

16. The portable electronic device as recited in claim 12, further comprising a plurality of threaded inserts, each of the threaded inserts retained within a retaining hole defined by one of the plurality of housing sections.

17. A system for retaining internal components of an electronic device within a housing that comprises a plurality of housing sections, the system comprising:

a plurality of threaded inserts, each of the threaded inserts being retained within a retention hole defined by at least one of the plurality of housing sections, wherein each of the threaded inserts comprises:

a plurality of protrusions that interact with the retention hole to prevent rotation of the threaded insert within the retention hole, and interior surfaces that define a threaded hollow configured to receive a fastener; and a plurality of fasteners, each of the fasteners being configured to couple at least one of the internal components within an interior volume defined by the housing by engaging the threaded hollow of a corresponding one of the plurality of threaded inserts.

18. The system as recited in claim 17, wherein at least one of the threaded inserts is coupled within the retention hole by press fitting the threaded insert into the retention hole.

19. The system as recited in claim 17, wherein at least one of the threaded inserts is retained within the retention hole by an adhesive coupling.

20. The system as recited in claim 17, wherein the retention hole includes a plurality of notches complementary to the plurality of protrusions of a corresponding one of the plurality of threaded inserts.

* * * * *